United States Patent
Watanabe

[11] Patent Number: 6,118,992
[45] Date of Patent: Sep. 12, 2000

[54] MIXER CIRCUIT IN CATV UP/DOWN CONVERTER

[75] Inventor: Takashi Watanabe, Kanagawa, Japan

[73] Assignee: Mitsumi Electronic Co., Ltd., Tokyo, Japan

[21] Appl. No.: 09/086,490

[22] Filed: May 29, 1998

[30] Foreign Application Priority Data

May 30, 1997  [JP]  Japan ................................ 9-157398

[51] Int. Cl.[7] .................................................. H04B 1/26
[52] U.S. Cl. ........................................ 455/326; 455/330
[58] Field of Search .................................. 455/326, 330, 455/318, 313, 319, 323

[56] References Cited

U.S. PATENT DOCUMENTS

| | | | |
|---|---|---|---|
| 4,870,701 | 9/1989 | Ito et al. .............................. | 455/330 |
| 5,157,786 | 10/1992 | Muterspaugh ........................ | 455/330 |
| 5,307,518 | 4/1994 | Maeda et al. ........................ | 455/326 |

*Primary Examiner*—Thanh Cong Le
*Assistant Examiner*—Myron K. Wyche
*Attorney, Agent, or Firm*—Whitham, Curtis & Whitham

[57] ABSTRACT

This mixer circuit is configured so that a second capacitor (C10 and C11) having capacitance smaller than that of a first capacitor (C1 and C3) is connected in parallel with the first capacitor (C1 and C3), the first capacitor (C1 and C3) being connected to output terminals of the diode bridge so that an anode and a cathode of respective diodes connected in series to constitute the diode bridge are made equal in electric potential to each other by the first capacitor (C1 and C3) in terms of radio frequency.

3 Claims, 3 Drawing Sheets

MIXER CIRCUIT IN CATV UP/DOWN CONVERTER

BACKGROUND OF THE INVENTION

1. Field of the Invention

The present invention relates to a mixer circuit in a CATV UP/DOWN converter, and particularly to a mixer circuit in a CATV UP/DOWN converter comprising a double-balanced mixer including a diode bridge.

2. Related Art

The input frequency used in a conventional CATV UP/DOWN converter was in a range of from 57 MHz to 570 MHz in America by way of example. This input frequency has, however, a tendency that the reception band is widened to a range of from 57 MHz to 860 MHz.

However, a mixer circuit in a first stage used at present is constituted by a double-balanced mixer including a diode bridge as shown in FIG. 3, and a radio-frequency input signal is sent to the secondary side of a transformer T2 through transformers T1 and T2. A local oscillation frequency signal is supplied to an intermediate terminal of the secondary side of the transformer T2 through a capacitor Cp1. The radio frequency is converted into an intermediate frequency in this portion. Then, the two terminals on the output side of the transformer T2 are connected to connection terminals Pa and Pb respectively. The anode of a diode D1 and the cathode of a diode D2, which are connected reversely, are connected to the connection terminal Pa, and the cathode of a diode D3 and the anode of a diode D4, which was connected reversely, are connected to the connection terminal Pb.

Between the cathode of the diode D1 and the anode of the diode D3, a capacitor C1 is connected for making the respective electric potentials of the cathode of the diode D1 and the anode of the diode D3 equal to each other in terms of radio frequency (shortcircuiting the diodes D1 and D3 in terms of radio frequency). Also between the anode of the diode D2 and the cathode of the diode D4, a capacitor C3 is connected for making the respective electric potentials of the anode of the diode D2 and the cathode of the diode D4 equal to each other in terms of radio frequency.

In addition, the cathode of the diode D1 is connected to one terminal of the capacitor C2 through a point M, and further connected to one input terminal Ta of a transformer T3. On the other hand, the anode of the diode D3 is connected to a coil L3 through a point N. The other terminal of the coil L1 is connected to the other terminal of the capacitor C2, and further grounded through a resistor R1. Further, the output terminal of the transformer T3 on the side connected to the one input terminal Ta is connected to one terminal of a parallel circuit of a capacitor C5 and a coil L5 through a coil L3.

In addition, the cathode of the diode D4 is connected to one terminal of the capacitor C3 through a point S, and further connected to the other input terminal Tb of the transformer T3. In addition, the anode of the diode D2 is connected to a coil L2 through a point P. The other terminal of the coil L2 is connected to one terminal of a capacitor C4. In this case, the capacitor C4 is connected in parallel with the above-mentioned resistor R1.

On the other hand, the output terminal of the transformer T3 on the side connected to the other input terminal Tb is grounded. In such a configuration, the frequency characteristic of the mixer circuit does not extend, and the intermediate-frequency characteristic also deteriorates.

Particularly, in a band of from 57 to 860 MHz, the frequency characteristic as a double-balanced mixer also depends on the capacitor C1 for making the respective electric potentials of the cathode and the anode of the diodes D1 and D3 equal to each other in terms of radio frequency, and the capacitor C3 for making the respective electric potentials of the anode and the cathode of the diodes D2 and D4 equal to each other in terms of radio frequency. Generally, the capacitance of this capacitor C3 is about 1,000 PF. With such a capacitance, however, there was a problem that the frequency characteristic on the high frequency side, including the frequency characteristic of a balun, the characteristic of circuit configuration (portions A and B) to the input terminals Ta and Tb of the transformer T3 in the post-stage of the diode bride, and the characteristic of the diodes, does not extend by additional inductance and capacitance caused by the parts such as the diode bridge, the transformers, and so on, and the pattern on a board on which the parts are connected, if the input frequency becomes higher.

SUMMARY OF THE INVENTION

In order to solve the above problem, provided is a mixer circuit in a CATV UP/DOWN converter comprising a double-balanced mixer including a diode bridge, characterized in that a second capacitor having capacitance smaller than that of a first capacitor is connected in parallel with the first capacitor, the first capacitor being connected to output terminals of the diode bridge so that an anode and a cathode of respective diodes connected in series to constitute the diode bridge are made equal in electric potential to each other by the first capacitor in terms of radio frequency.

With such a configuration, loss and distortion characteristic can be more improved in a wide range of from 57 to 860 MHz than the conventional case.

BRIEF DESCRIPTION OF THE DRAWINGS

FIG. 2(a) is a loss frequency characteristic diagram, FIG. 2(b) is a CTB frequency characteristic diagram.

DETAILED DESCRIPTION OF THE PREFERRED EMBODIMENTS

Figure 1:
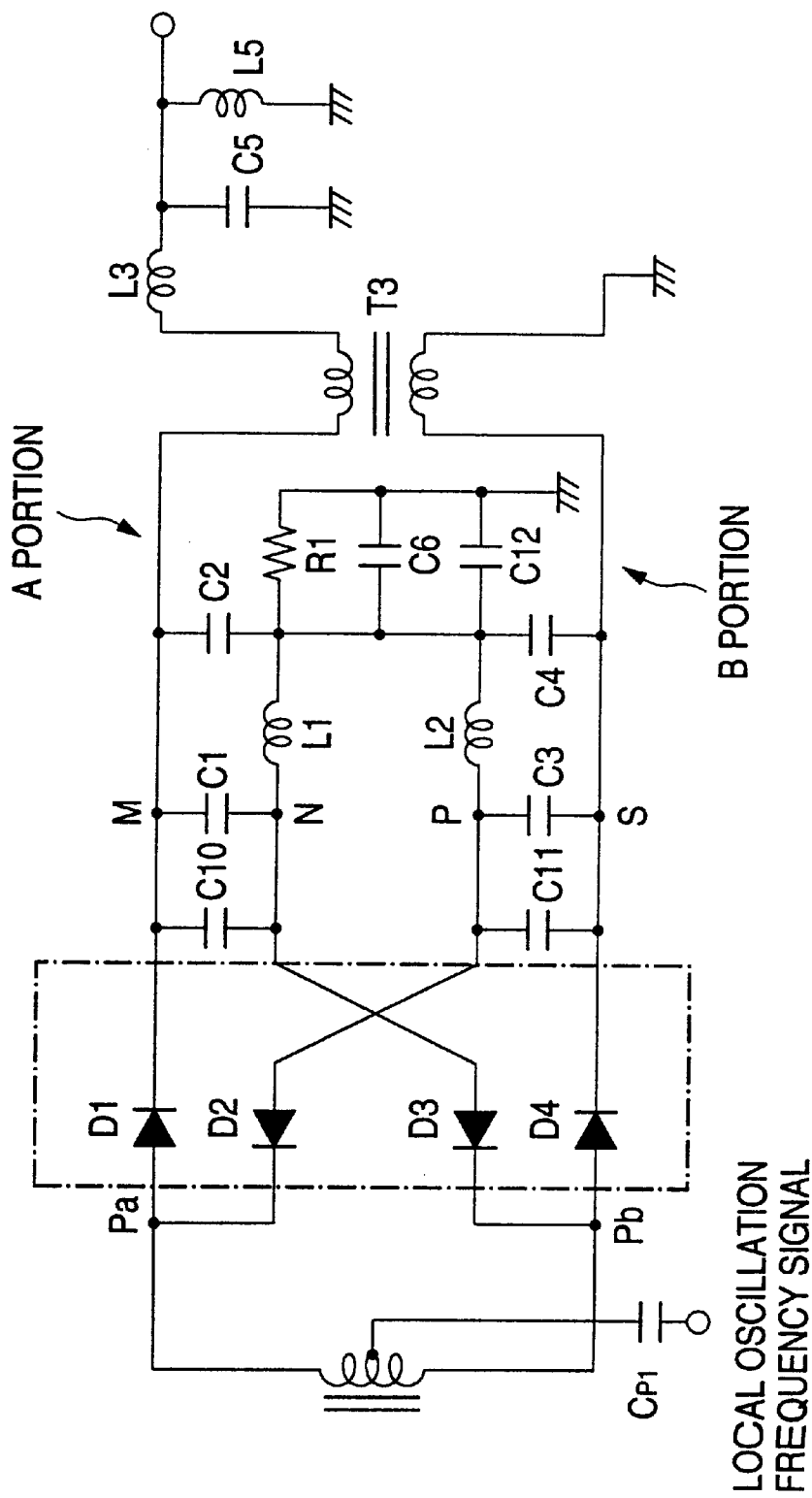
FIG. 1 is a circuit diagram showing a mode for carrying out a mixer circuit in a CATV UP/DOWN converter according to the present invention.
Figure 3:
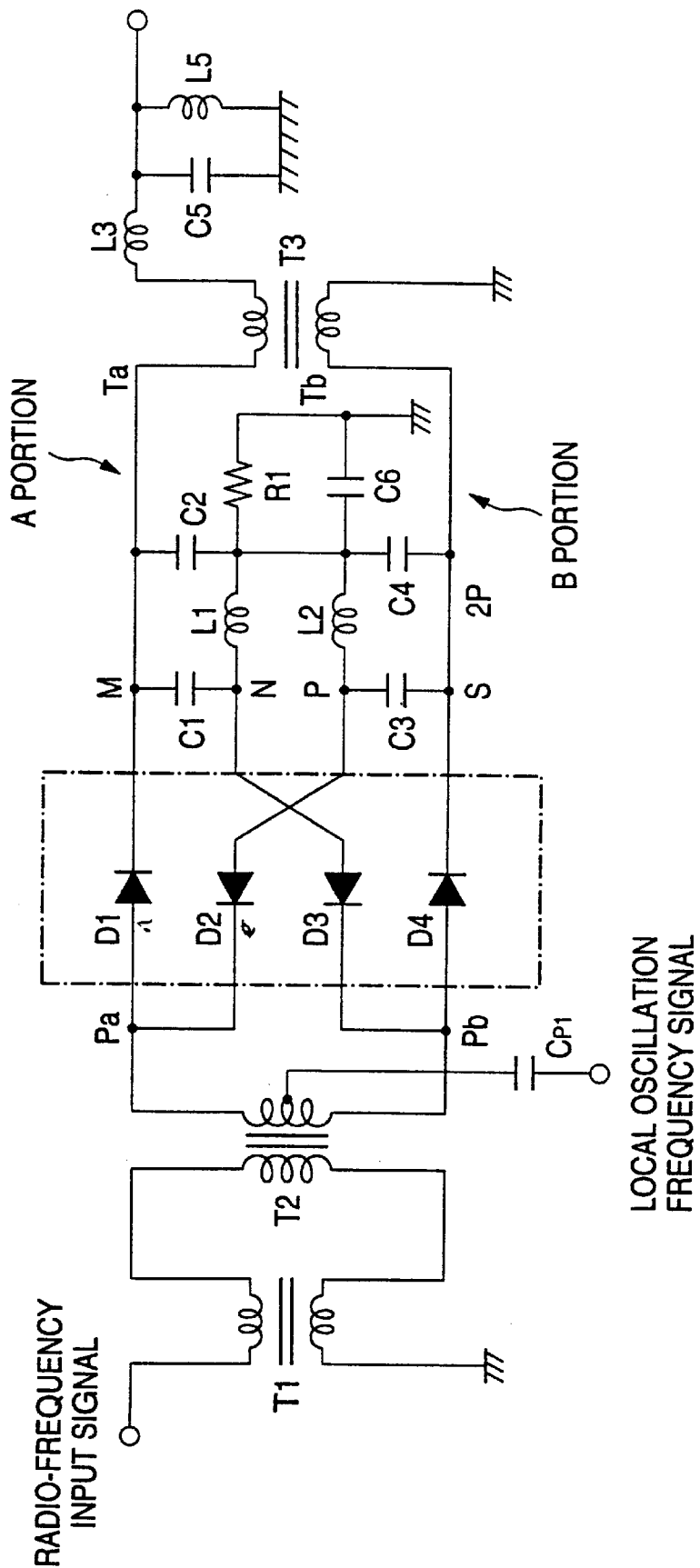
FIG. 3 is a circuit diagram showing an example of a conventional mixer circuit in a CATV UP/DOWN converter.

FIG. 1 shows a mode for carrying out a mixer circuit in a CATV UP/DOWN converter according to the present invention. In FIG. 1, parts the same as those in FIG. 3 are referenced correspondingly.

In FIG. 1, the circuit configuration of the post-stage of a transformer T2 will be described. A local oscillation frequency signal is supplied to an intermediate terminal of the secondary side of the transformer T2 through a capacitor Cp1. The radio frequency is converted into an intermediate frequency in this portion. Then, the two terminals on the output side of the transformer T2 are connected to connection terminals Pa and Pb respectively. The anode of a diode D1 and the cathode of a diode D2, which are connected reversely, are connected to the connection terminal Pa, and the cathode of a diode D3 and the anode of a diode D4, which are reversely connected, are connected to the connection terminal Pb.

Between the cathode of the diode D1 and the anode of the diode D3, a capacitor C1 is connected for making the respective electric potentials of the cathode of the diode D1 and the anode of the diode D3 equal to each other in terms of radio frequency (shortcircuiting them in terms of radio frequency). Also between the anode of the diode D2 and the cathode of the diode D4, a capacitor C3 is connected for making the respective electric potentials of the anode of the diode D2 and the cathode of the diode D4 equal to each other in terms of radio frequency.

Further, capacitors C10 and C11 with small capacitance characterized according to the present invention are connected in parallel with the capacitors C1 and C3, respectively. In addition, the cathode of the diode D1 is connected to one terminal of the capacitor C2 through a point M, and further connected to one input terminal Ta of a transformer T3. In addition, the anode of the diode D3 is connected to a coil L1 through a point N. The other terminal of the coil L1 is connected to the other terminal of the capacitor C2, and further grounded through a resistor R1.

Further, the output terminal of the transformer T3 on the side connected to the one input terminal Ta is connected to one terminal of a parallel circuit of a capacitor C5 and a coil L5 through a coil L3.

In addition, the cathode of the diode D4 is connected to one terminal of the capacitor C3 through a point S, and further connected to the other input terminal Tb of the transformer T3. In addition, the anode of the diode D2 is connected to a coil L2 through a point P. The other terminal of the coil L2 is connected to one terminal of a capacitor C6. In this case, the capacitor C6 is connected in parallel with the above-mentioned resistor R1.

Further, the output terminal of the transformer T3 on the side connected to the other input terminal Tb is grounded. In addition, a capacitor 12 with small capacitance characterized according to the present invention is connected to the parallel circuit of the resistor R1 and the capacitor C6 disposed between the coils L1 and L2 and the ground.

As is understood from the above configuration, the portion characterized according to the present invention is a point in that the capacitors C10 and C11 are additionally provided in parallel with the capacitors C1 and C3.

In such a manner, the points M, N, P and S can be made equal to each other in electric potential by the addition of the capacitors C10 and C11.

Although the set of the coil L1 and the capacitor C2 and the set of the coil L2 and the capacitor C4 are tuned near 959 MHz which is an intermediate frequency of the first stage, distortion and loss characteristic in the frequency characteristic of the constituent portions of the circuits A and B or the respective parts can be improved by the addition of the capacitor C12 in parallel with the capacitor C6 when the input frequency becomes higher.

Figure 2:
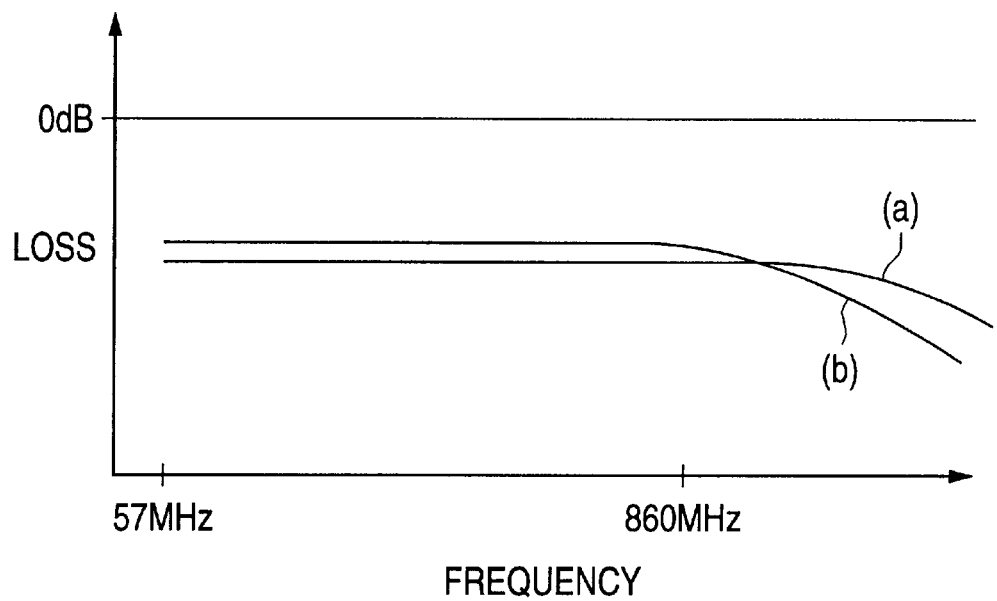
FIG. 2 is a characteristic diagram for comparing the characteristic according to the present invention with the conventional case.
Figure 2:
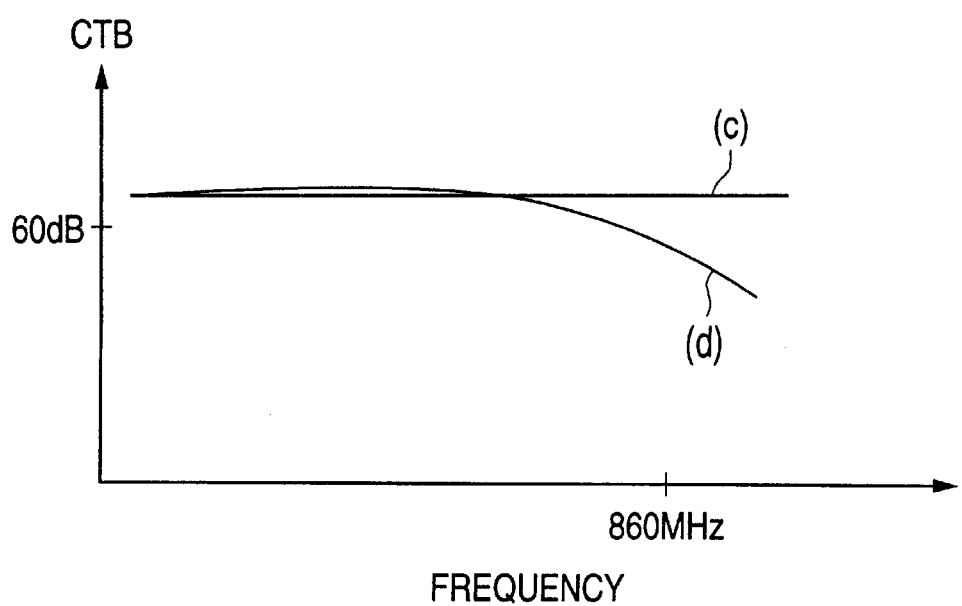

FIG. 2(a) shows the loss-frequency characteristic when the capacitances of the capacitors C1, C3 and C6 were 1,000 pF, and the capacitances of the capacitors C10, C11 and C12 were 8 pF, in the circuit configuration of FIG. 1. On the other hand, FIG. 2(b) shows the CTB-frequency characteristic. FIGS. 2(a) and (b) show those characteristics in comparison with conventional characteristics respectively. In FIGS. 2(a) and (b), the characteristics a and c show those according to the present invention, while the characteristics b and d show those in the conventional case.

As is understood from these characteristics, according to the present invention, it is possible to improve the distortion and loss characteristics, so that it is possible to obtain a superior characteristic uniform over a broad range. Particularly in a range of from 800 to 860 MHz, CTB can be improved by 5 db or more, and loss can be improved by 0.5 db or more.

As has been described above, if a mixer circuit according to the present invention is used, it is possible to obtain a mixer circuit in which loss and CTB are improved over a broad range of from 57 to 860 MHz, in comparison with the conventional case. Particularly in the configuration of the above-mentioned carrying-out mode, it was confirmed that loss could be improved by 0.5 dB or more, and CTB could be improved by 5 dB or more.

In addition, even if the band is further expanded in the future, for example, to a range of from 57 MHz to 1 GHz, it is possible to obtain a mixer circuit in which loss and CTB are improved in comparison with the conventional case, by adding capacitors with capacitances of smaller than those of the capacitors C10, C11 and C12, respectively.

What is claimed is:

1. A mixer circuit in a cable television (CATV) UP/DOWN converter comprising:

a double-balanced mixer including a diode bridge;

a first capacitor and a second capacitor having capacitance smaller than that of said first capacitor, said second capacitor connected in parallel with said first capacitor, said first capacitor connected to output terminals of said diode bridge so that an anode and a cathode of respective diodes connected in series to comprise said diode bridge are made equal in electric potential to each other by said first capacitor in terms of radio frequency.

2. A mixer circuit in a CATV UP/DOWN converter as recited in claim 1, further comprising:

a third capacitor, a fourth capacitor and a fifth capacitor having capacitance smaller than that of said fourth capacitor, said fifth capacitor connected in parallel with said fourth capacitor, said fourth capacitor being disposed between a third capacitor and the ground, said third capacitor being disposed in a post-stage of said first capacitor so that an anode and a cathode of respective diodes connected in series are made equal in electric potential to each other by said first capacitor in terms of radio frequency.

3. A double balanced mixer circuit, comprising:

a diode bridge comprising first, second, third and fourth diodes arranged in alternating directions;

an input transformer connected to said diode bridge, said input transformer connected to receive a radio input signal and a local oscillation frequency signal;

an output transformer; and an analog circuit connected between said diode bridge and said output transformer, said analog circuit comprising:

a first inductor and a second inductor connected together at one end and connected respectively at a second end to said third and said second diodes;

first and second capacitors, said first capacitor connected between said first diode and said third diode and said second capacitor connected between said second diode and said fourth diode; and third and fourth capacitors, having a smaller capacitive value than said first and second capacitors, said third capacitor connected in parallel with said first capacitor and said fourth capacitor connected in parallel with said second capacitor, wherein connecting additional capacitors in parallel with said first and second capacitors, with progressively smaller capacitive values, increases the frequency range said circuit.

* * * * *